United States Patent
Murata et al.

(10) Patent No.: US 7,423,271 B2
(45) Date of Patent: Sep. 9, 2008

(54) INFRARED SENSOR AND METHOD FOR DRIVING THE SAME

(75) Inventors: Takahiko Murata, Osaka (JP); Takumi Yamaguchi, Kyoto (JP); Shigetaka Kasuga, Osaka (JP); Takayoshi Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 6 days.

(21) Appl. No.: 11/665,603

(22) PCT Filed: Jun. 9, 2006

(86) PCT No.: PCT/JP2006/011617

§ 371 (c)(1),
(2), (4) Date: Apr. 18, 2007

(87) PCT Pub. No.: WO2007/046167

PCT Pub. Date: Apr. 26, 2007

(65) Prior Publication Data

US 2008/0087823 A1    Apr. 17, 2008

(30) Foreign Application Priority Data

Oct. 21, 2005    (JP) .............................. 2005-306852

(51) Int. Cl.
  *G01J 5/34*    (2006.01)
  *H01L 27/14*    (2006.01)
(52) U.S. Cl. ................................. 250/338.4
(58) Field of Classification Search .............. 250/338.1, 250/338.3, 338.4
See application file for complete search history.

(56) References Cited

U.S. PATENT DOCUMENTS

| | | | | |
|---|---|---|---|---|
| 5,424,544 A | * | 6/1995 | Shelton et al. | 250/332 |
| 5,457,318 A | * | 10/1995 | Robinson et al. | 250/332 |
| 5,572,059 A | * | 11/1996 | Walker et al. | 257/448 |
| 5,577,309 A | * | 11/1996 | Frank et al. | 29/25.42 |
| 5,602,392 A | * | 2/1997 | Owen et al. | 250/338.3 |
| 5,638,599 A | * | 6/1997 | Beratan et al. | 29/854 |
| 5,959,298 A | * | 9/1999 | Belcher et al. | 250/338.3 |
| 6,635,495 B2 | * | 10/2003 | Hashimoto et al. | 438/3 |
| 6,674,081 B2 | * | 1/2004 | Hashimoto et al. | 250/338.2 |
| 7,038,206 B2 | * | 5/2006 | Chen et al. | 250/338.2 |
| 7,332,717 B2 | * | 2/2008 | Murata et al. | 250/338.1 |
| 2003/0066967 A1 | * | 4/2003 | Hashimoto et al. | 250/338.2 |

(Continued)

FOREIGN PATENT DOCUMENTS

JP    11-271141 A    10/1999

(Continued)

*Primary Examiner*—David P. Porta
*Assistant Examiner*—David S Baker
(74) *Attorney, Agent, or Firm*—McDermott Will & Emery LLP

(57) ABSTRACT

An infrared sensor includes a plurality of reference pixel units 2 arranged in a matrix pattern and series capacitor elements 14 provided in a one-to-one correspondence with the reference pixel units 2. The reference pixel units 2 each include an output line 30, a reference capacitor element 13 connected via a switching element 17 between the output line and the ground, and a plurality of infrared-detecting capacitor elements 12 connected via associated switching elements 16 between the output line 30 and the ground. Each series capacitor element 14 is connected to the associated output line 30.

13 Claims, 11 Drawing Sheets

U.S. PATENT DOCUMENTS

2005/0072925 A1* 4/2005 Chen et al. ............... 250/338.2
2005/0279939 A1* 12/2005 Yoshida et al. ............. 250/332
2007/0125949 A1* 6/2007 Murata et al. ............ 250/338.1

FOREIGN PATENT DOCUMENTS

| JP | 2000-114467 A | 4/2000 |
| JP | 2000114467 A * | 4/2000 |
| JP | 2001-343282 A | 12/2001 |
| JP | 2002-365130 A | 12/2002 |
| JP | 2002365130 A * | 12/2002 |
| WO | WO 2006/043384 A1 | 4/2006 |

* cited by examiner

INFRARED SENSOR AND METHOD FOR DRIVING THE SAME

RELATED APPLICATIONS

This application is the U.S. National Phase under 35 U.S.C. § 371 of International Application No. PCT/JP2006/311617, filed on Jun. 9, 2006, which claims priority of JP 2005-306852, filed on Oct. 21, 2005, the disclosures of which Applications are incorporated by reference herein.

TECHNICAL FIELD

The present invention relates to infrared sensors for detecting infrared light radiated from objects and human bodies and methods for driving the same.

BACKGROUND ART

An infrared sensor can detect infrared light radiated from an object such as a human body. With the ability for non-contact detection of the existence or the temperature of an object, it has been expected to find applications in a variety of fields of technology. Particularly, an infrared sensor including a plurality of infrared sensor units arranged in a matrix pattern is capable of obtaining a two-dimensional infrared light image, and has been expected to find applications in an even wider variety of fields of technology. Favorable candidates for such infrared sensors include dielectric bolometers detecting a change in the dielectric constant caused by a temperature change through the application of an electric field, because they do not require cooling or a chopper circuit.

FIG. 12 shows a signal reading circuit of a known dielectric bolometer-type infrared sensor. As shown in FIG. 12, a series capacitor element 201 and an infrared-detecting capacitor element 202 are connected in series with each other via a node 210. The infrared-detecting capacitor element 202 has characteristics such that the capacitance thereof varies depending on the intensity of infrared light incident on the element. The characteristics of the element are set so that the capacitance value of the infrared-detecting capacitor element 202 and that of the series capacitor element 201 are equal to each other when there is no infrared light incident thereon.

An alternating-current power supply 204 and an alternating-current power supply 205 are connected to the series capacitor element 201 and the infrared-detecting capacitor element 202 for driving the capacitor elements 201 and 202, respectively, wherein the alternating-current power supply 204 and the alternating-current power supply 205 have the same amplitude and inverted phases.

The node 210 is connected to an output terminal 206 via a transistor 203, and the potential of the node 210 can be taken out to the output terminal 206 by turning ON the transistor 203 via a signal line $S_{SW}$.

The potential of the node 210 is determined by the capacitance values of the series capacitor element 201 and the infrared-detecting capacitor element 202 and the voltages (amplitudes) of the alternating-current power supply 204 and the alternating-current power supply 205. Therefore, when infrared light is incident on the infrared-detecting capacitor element 202, whereby the capacitance value of the infrared-detecting capacitor element 202 increases as shown in FIG. 13, there is obtained an output curve as shown by an output curve A in FIG. 13. In FIG. 13, a curve C and a curve D represent output voltages of the alternating-current power supply 204 and the alternating-current power supply 205, respectively.

When there is no infrared light incident on the infrared-detecting capacitor element 202, the capacitance value of the series capacitor element 201 and that of the infrared-detecting capacitor element 202 are equal to each other, whereby the potential of the node 210 is always zero as indicated by B in FIG. 13. In view of the above, infrared light can be detected with high accuracy (see, for example, Patent Document 1).
Patent Document 1: Japanese Unexamined Application Publication No. 2002-365130

DISCLOSURE OF THE INVENTION

Problems that the Invention is to Solve

The known infrared sensor unit requires a single infrared-detecting capacitor element and a single series capacitor element. This causes a problem that the proportion of infrared-detecting capacitor elements in a pixel, i.e., the aperture ratio of the pixel, becomes smaller than when the sensor has no series capacitor element. In particular, when a plurality of infrared sensor units are arranged in a matrix pattern, the area of the pixel is significantly limited so that a reduction in the aperture ratio becomes a big problem.

In a case where there is a difference between the capacitance value of an infrared-detecting capacitor element and that of an associated series capacitor element when no infrared light is incident on the infrared-detecting capacitor element, an offset occurs in the output of the sensor. This deteriorates the measurement accuracy of the sensor. When, in order to prevent the measurement accuracy from being deteriorated due to the offset, a circuit for correcting the offset is provided, this further reduces the aperture ratio.

The present invention is made to solve the above-mentioned known problems, and its object is to achieve an infrared sensor providing high measurement accuracy while preventing the aperture ratio of a pixel from being reduced.

Means of Solving the Problems

In order to achieve the above-mentioned object, an infrared sensor of the present invention is configured such that a plurality of infrared-detecting capacitor elements are connected to a mutual series capacitor element and a mutual reference capacitor element.

To be specific, an infrared sensor of the present invention includes: a plurality of reference pixel units each including an output line, a reference capacitor element connected via a switching element between the output line and a ground, and a plurality of infrared-detecting capacitor elements whose capacitance values vary depending on the intensities of infrared light incident on the infrared-detecting capacitor elements, said reference pixel units being arranged in a matrix pattern; and a plurality of series capacitor elements each connected between the associated output line and an associated power supply line, said series capacitor elements being provided in a one-to-one correspondence with the reference pixel units.

According to the infrared sensor of the present invention, the series capacitor elements are provided in a one-to-one correspondence with the reference pixel units each including the infrared-detecting capacitor elements. This can significantly reduce the proportion of the area occupied by each series capacitor element relative to the area occupied by some of the infrared-detecting capacitor elements associated with the series capacitor element. This reduction can improve the aperture ratio of each reference pixel unit. Furthermore, since the reference pixel units each include the reference capacitor element, use of the reference capacitor element can reduce the influence of an offset and improve the measurement accuracy of the infrared sensor. Moreover, since the reference capacitor element is shared by the plurality of infrared-detecting capacitor elements, this can suppress a reduction in the aperture ratio of each pixel reference unit due to the presence of reference capacitor elements.

In the infrared sensor of the present invention, the capacitance value of the reference capacitor element and that of the associated series capacitor element are preferably equal to that of each of the associated infrared-detecting capacitor elements when there is no infrared light incident on said associated infrared-detecting capacitor elements. This configuration can certainly reduce the influence of an offset.

In the infrared sensor of the present invention, in each said reference pixel unit, the reference capacitor element and the infrared-detecting capacitor elements are preferably arranged in a one-dimensional array.

In the infrared sensor of the present invention, in each said reference pixel unit, the reference capacitor element and the infrared-detecting capacitor elements are preferably arranged in a two-dimensional array.

In the infrared sensor of the present invention, the series capacitor elements are preferably placed outside a pixel area on which infrared light is incident.

In the infrared sensor of the present invention, the series capacitor elements and the reference capacitor elements are preferably placed outside a pixel area on which infrared light is incident. This configuration can avoid a reduction in the aperture ratio of each reference pixel unit due to the presence of series capacitor elements and reference capacitor elements with reliability.

In the infrared sensor of the present invention, the reference capacitor elements are preferably located in a first reference capacitor element formation area and a second reference capacitor element formation area located to both sides of the pixel area, respectively, with the pixel area interposed between the first and second reference capacitor element formation areas, some of the infrared-detecting capacitor elements included in the same reference pixel unit as the reference capacitor element located in the first reference capacitor element formation area are preferably located in a region of the pixel area near the first reference capacitor element formation area, and some of the infrared-detecting capacitor elements included in the same reference pixel unit as the reference capacitor element located in the second reference capacitor element formation area are preferably located in a region of the pixel area near the second reference capacitor element formation area. In this case, the series capacitor elements are preferably located in a region of the infrared sensor located outside the pixel area and to a side of the pixel area to which the reference capacitor elements associated with the series capacitor elements are located. With this configuration, the distances between the series capacitor element or the reference capacitor element and the infrared-detecting capacitor elements can be shortened. This can improve the measurement accuracy of the infrared sensor.

In the infrared sensor of the present invention, a potential of the output line is preferably brought to a reference potential by turning ON the switching element connected between the reference capacitor element and the output line and applying a predetermined voltage between the series capacitor element and the reference capacitor element, a potential of the output line is preferably brought to a detection potential by turning ON the switching element connected between predetermined one of the infrared-detecting capacitor elements and the output line and applying a predetermined voltage between the series capacitor element and said predetermined one of the infrared-detecting capacitor elements, and the potential difference between the reference potential and the detection potential is preferably output as an output signal indicating the intensity of infrared light incident on said predetermined one of the infrared-detecting capacitor elements. With this configuration, the influence of an offset can be reduced. This can improve the measurement accuracy.

In the infrared sensor of the present invention, a potential of the output line is preferably brought to a reference potential by turning ON the switching element connected between the reference capacitor element and the output line and applying a predetermined voltage between the series capacitor element and the reference capacitor element, a potential of the output line is preferably brought to a detection potential by turning ON the switching element connected between predetermined one of the infrared-detecting capacitor elements and the output line and applying a predetermined voltage between the series capacitor element and said predetermined one of the infrared-detecting capacitor elements, the potential difference between the reference potential and the detection potential is preferably output as an output signal indicating the intensity of infrared light incident on said predetermined one of the infrared-detecting capacitor elements, and the intensity of infrared light incident on a part of the reference pixel unit provided with the reference capacitor element is preferably calculated using respective output signals of the plurality of infrared-detecting capacitor elements arranged around the reference capacitor element and included in one of the reference pixel units to which the reference capacitor element belongs. With this configuration, loss of data can be suppressed. This can provide sharp infrared images.

A method for driving an infrared sensor of the present invention is directed toward a method for driving an infrared sensor including: a reference pixel unit including an output line, a reference capacitor element connected via a switching element between the output line and a ground, and a plurality of infrared-detecting capacitor elements whose capacitance values vary depending on the intensities of infrared light incident on the infrared-detecting capacitor elements; and a series capacitor element connected between the output line and a power supply line. The method includes the step of (a) sequentially outputting the intensities of infrared light incident on the infrared-detecting capacitor elements included in the reference pixel unit, wherein the step (a) includes the sub-steps of: (a1) turning ON the switching element connected to the reference capacitor element while electrically connecting the reference capacitor element and the output line together, and thereafter applying a predetermined voltage between the reference capacitor element and the series capacitor element, thereby reading a reference potential and delivering the reference potential to the output line; (a2) after the step (a1), turning ON the switching element connected to one of the plurality of infrared-detecting capacitor elements while electrically connecting said one of the plurality of infrared-detecting capacitor elements and the output line together, and thereafter applying a predetermined voltage between said one of the plurality of infrared-detecting capacitor elements and the series capacitor element, thereby reading a detection potential and delivering the detection potential to the output line; and (a3) after the steps (a1) and (a2), determining a potential difference between the reference potential and the detection potential and outputting the determined potential difference as the intensity of infrared light incident on said one of the plurality of infrared-detecting capacitor elements.

According to the method of the present invention, in order to improve the aperture ratio of each reference pixel unit, the infrared sensor is configured such that the reference capacitor element is shared by the plurality of infrared-detecting capacitor elements. Such an infrared sensor also permits a reduction in the influence of an offset and measurements of the intensities of infrared light with accuracy.

In the method of the present invention, the reference capacitor element and the infrared-detecting capacitor elements are preferably located in a pixel area on which infrared light is incident, and it is preferable that the method further comprises the step of (b) after the step (a), calculating the intensity of infrared light incident on a part of the pixel area provided with the reference capacitor element on the basis of the intensities of infrared light incident on some of the plurality of infrared-detecting capacitor elements adjacent to the reference capacitor element.

In the method of the present invention, the step (b) is preferably the step of determining an average value of the intensities of infrared light incident on some of the plurality of infrared-detecting capacitor elements adjacent to the reference capacitor element.

EFFECTS OF THE INVENTION

According to the infrared sensor of the present invention, an infrared sensor can be achieved which has high detection accuracy while preventing the aperture ratio of a pixel from being reduced can be achieved.

DESCRIPTION OF REFERENCE NUMERALS

| | |
|---|---|
| 1 | pixel area |
| 2 | reference pixel units |
| 2A | reference pixel unit |
| 2B | reference pixel unit |
| 2C | reference pixel unit |
| 3 | reference capacitor element formation area |
| 12 | infrared-detecting capacitor elements |
| 12a | infrared-detecting capacitor element |
| 12b | infrared-detecting capacitor element |
| 12c | infrared-detecting capacitor element |
| 13 | reference capacitor elements |
| 14 | series capacitor elements |
| 15 | series capacitor element control switches |
| 16 | infrared-detecting capacitor element control switches |
| 16a | infrared-detecting capacitor element control switches |
| 16b | infrared-detecting capacitor element control switches |
| 16c | infrared-detecting capacitor element control switches |
| 17 | reference capacitor element control switches |
| 18 | bias control switches |
| 20 | vertical shift register |
| 21 | OR circuit |
| 22 | AND circuit |
| 23 | AND circuits |
| 30 | output lines |
| 30A | output line |
| 30B | output line |
| 30C | output line |
| 31 | infrared-detecting capacitor element control lines |
| 31A | infrared-detecting capacitor element control line |
| 31B | infrared-detecting capacitor element control line |
| 31C | infrared-detecting capacitor element control line |
| 32 | reference capacitor element control line |
| 33 | reference capacitor element select line |
| 34 | infrared-detecting capacitor element select line |
| 35 | power supply line |
| 37 | bias control line |
| 41 | output node |
| 42 | output terminal of vertical shift register |
| 43 | output terminal of vertical shift register |
| 44 | output terminal of vertical shift register |
| 45 | bias terminal |

BEST MODE FOR CARRYING OUT THE INVENTION

Embodiment 1

Figure 1:
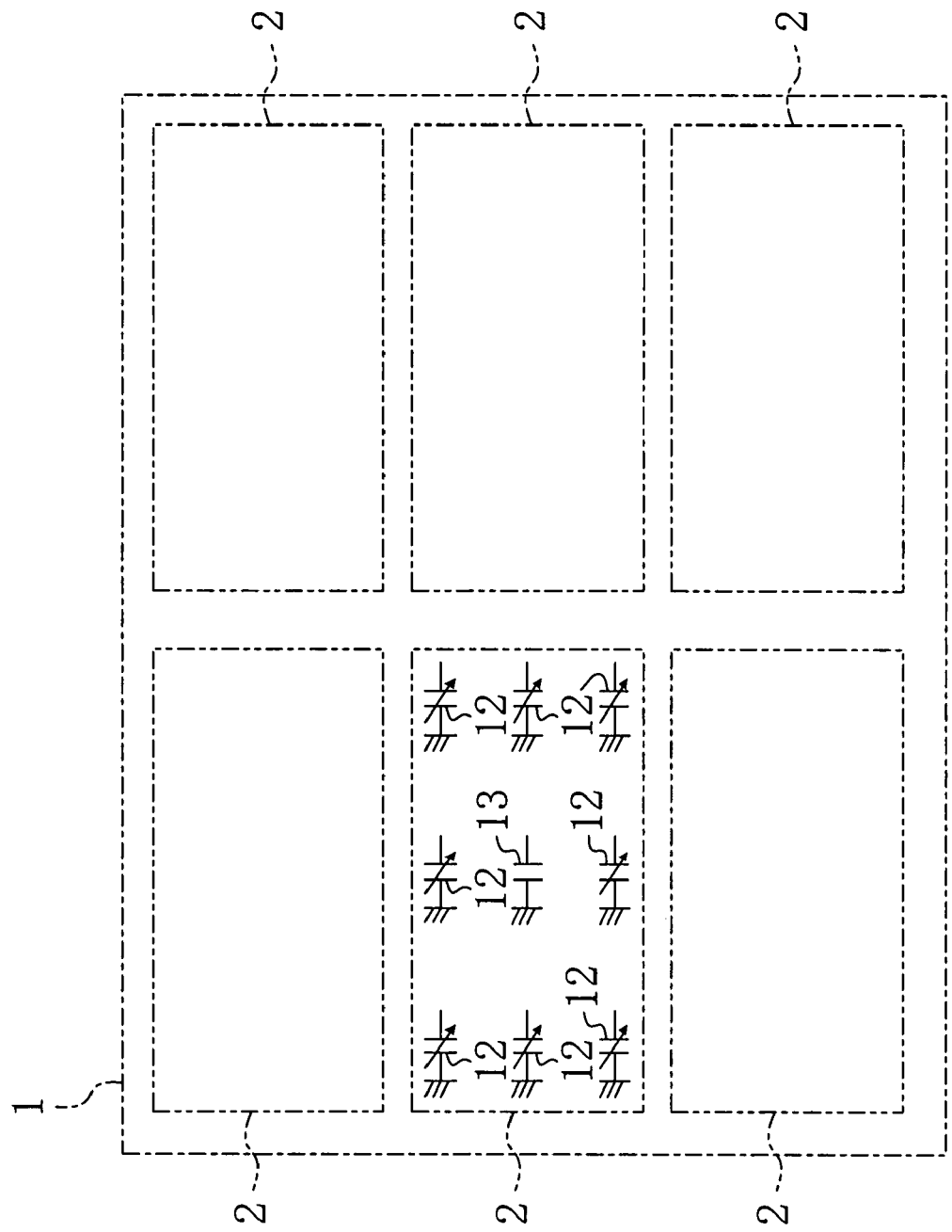
FIG. 1 is a layout diagram illustrating an infrared sensor according to a first embodiment of the present invention.

A first embodiment of the present invention will be described with reference to the drawings. FIG. 1 shows the layout of an infrared sensor according to the first embodiment. As shown in FIG. 1, in a pixel area 1 on which infrared light is incident, a plurality of reference pixel units 2 are arranged in a two-dimensional matrix pattern. Series capacitor elements, peripheral circuits and other elements are provided outside the pixel area 1.

The reference pixel units 2 each include a plurality of infrared-detecting capacitor elements 12 and a single reference capacitor element 13, which are arranged together in a two-dimensional matrix pattern.

Figure 2:
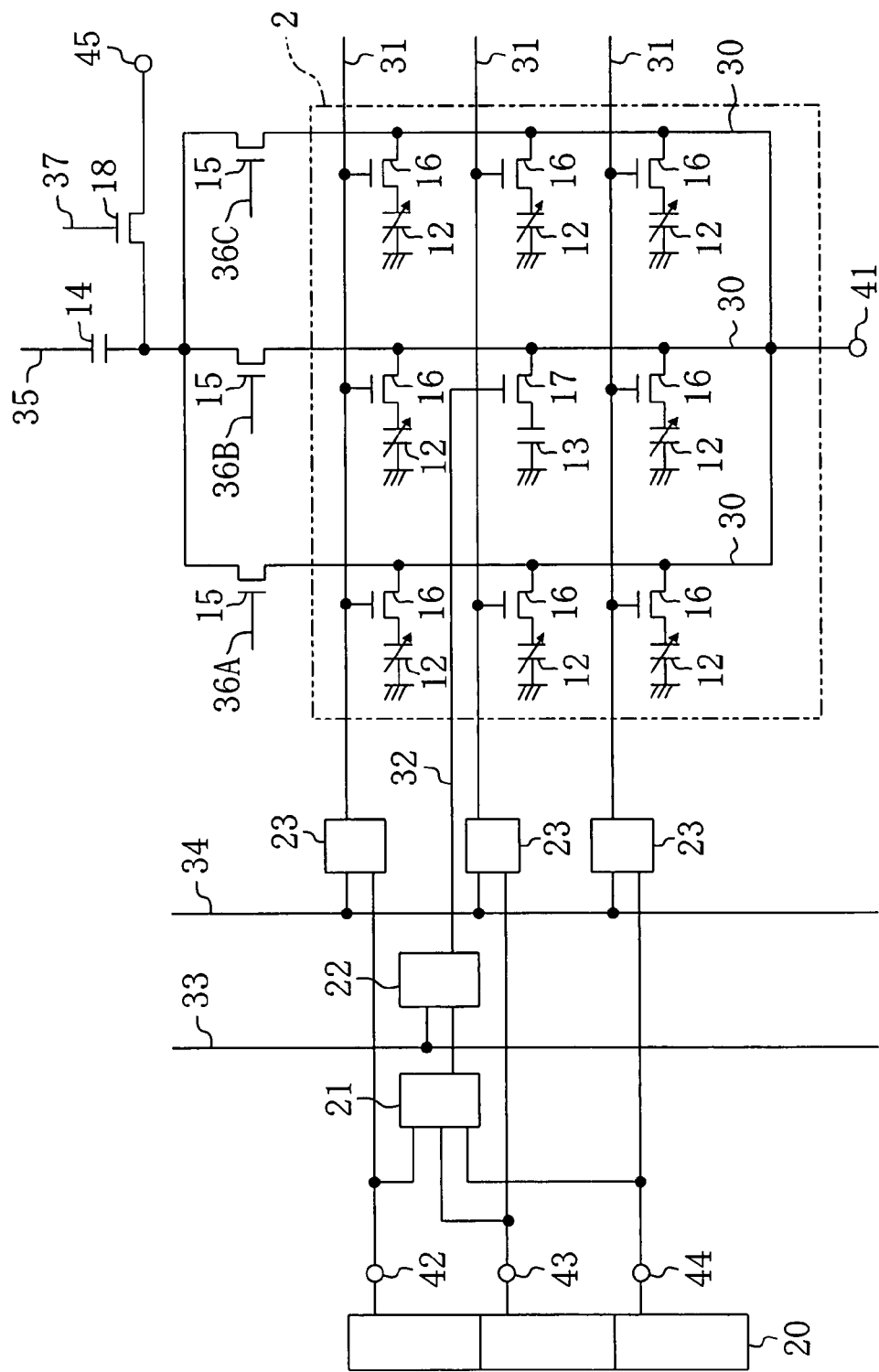
FIG. 2 is a circuit diagram illustrating a reference pixel unit of the infrared sensor of the first embodiment of the present invention and its peripheral circuits.

FIG. 2 shows a circuit configuration in which a reference pixel unit 2 of an infrared sensor of this embodiment and its peripheral circuits are extracted. As shown in FIG. 2, the reference pixel unit 2 is configured such that a single reference capacitor element 13 and eight infrared-detecting capacitor elements 12 are arranged in a matrix pattern of three rows by three columns.

In this embodiment, the reference capacitor element 13 is placed in the second row and the second column of the matrix pattern, i.e., the middle thereof. One terminal of the reference capacitor element 13 is grounded, and the other terminal is connected to one of output lines 30 along the second column via a reference capacitor element control switch 17 being a transistor. One terminal of each infrared-detecting capacitor element 12 is grounded, and the other terminal thereof is connected, via an infrared-detecting capacitor element control switch 16 being a transistor, to one of the output lines 30 along the column in which the infrared-detecting capacitor element 12 is placed.

The output lines 30 along the columns are connected together and provided with an output node 41. The output lines 30 along the columns are connected together via associated series capacitor element control switches 15 and thus connected to one terminal of a series capacitor element 14. The series capacitor element control switches 15 that are transistors provided somewhere along the associated output lines 30 can be separately controlled. Control terminals of the series capacitor element control switches 15 are connected to control lines 36A, 36B and 36C, respectively.

The capacitance value of the series capacitor element 14 and that of the reference capacitor element 13 are set to be substantially equal to that of each infrared-detecting capacitor element 12 when there is no infrared light incident on the infrared-detecting capacitor element 12. In other words, these capacitance values are equal to one another within the range of their tolerance occurring when the capacitor elements are fabricated by a known fabrication method.

The other terminal of the series capacitor element 14 is connected to a power supply line 35. A bias terminal 45 is connected via a bias control switch 18 between the series capacitor element 14 and the series capacitor element control switches 15, thereby applying a predetermined bias voltage therebetween. The bias control switch 18 is driven by a bias control line 37.

A control terminal of the reference capacitor element control switch 17 is connected to a reference capacitor element control line 32. Control terminals of the infrared-detecting capacitor element control switches 16 are connected to associated infrared-detecting capacitor element control lines 31 extending along the rows.

The reference capacitor element control line 32 is connected to an output terminal of an AND circuit 22. Input terminals of the AND circuit 22 are connected to a reference capacitor element select line 33 and an output terminal of an OR circuit 21, respectively. Each of input terminals of the OR circuit 21 is connected to associated one of the first-, second- and third-stage output terminals 42, 43 and 44 of a vertical shift register 20 having three stages.

The infrared-detecting capacitor element control lines 31 extending along the rows are connected to output terminals of associated AND circuits 23 provided somewhere along the rows. One of input terminals of each AND circuit 23 is connected to an infrared-detecting capacitor element select line 34. The other one thereof is connected to associated one of the output terminals 42, 43 and 44 of the vertical shift register 20.

Figure 3:
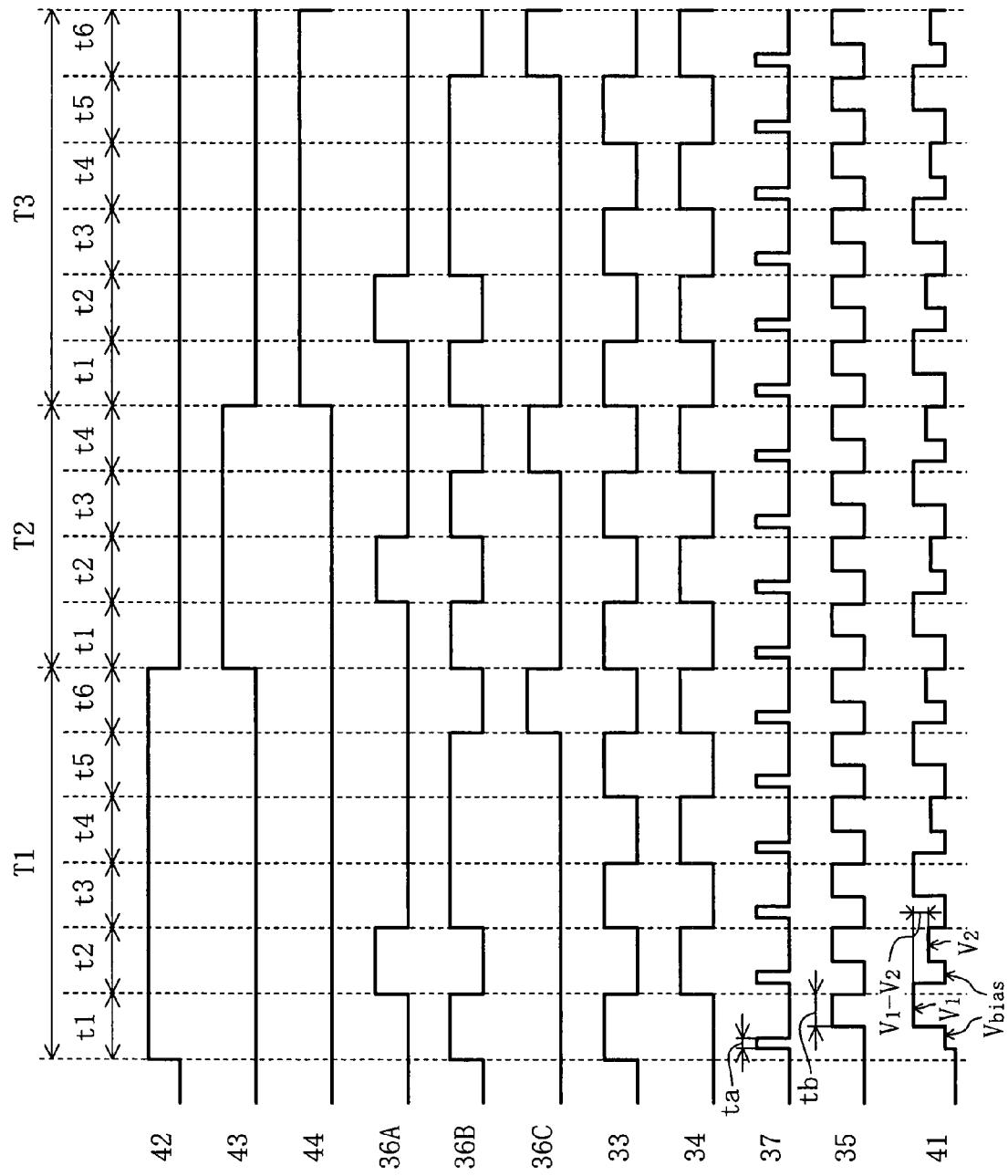
FIG. 3 is a timing chart illustrating an operation of the infrared sensor according to the first embodiment of the present invention.

An operation of the infrared sensor of this embodiment will be described hereinafter. FIG. 3 is a timing chart showing operations of the reference pixel unit 2 and its peripheral circuits both shown in FIG. 2.

At the beginning of time t1 of period T1, the voltage of a first-stage output terminal 42 of a vertical shift register 20 is brought to a high ("H") level. Thus, an "H" level signal is applied to an input terminal of an OR circuit 21, thereby bringing the output of the OR circuit 21 to the "H" level.

During time t1, the voltage of a reference capacitor element select line 33 is also brought to the "H" level, thereby bringing the voltage of a reference capacitor element control line 32 connected to the output of an AND circuit 22 to the "H" level. Thus, a reference capacitor element control switch 17 is brought into conduction, thereby connecting a reference capacitor element 13 and one of output lines 30 along the second column of the matrix pattern together. Furthermore, the voltage of a control line 36B is brought to the "H" level, thereby bringing one of series capacitor element control switches 15 provided somewhere along the second column of the matrix pattern into conduction. Consequently, a series capacitor element 14 is connected to the reference capacitor element 13.

During time interval ta, an "H"-level voltage is applied to a bias control line 37, thereby bringing a bias control switch 18 into conduction. Thus, a bias voltage is applied to a node between the series capacitor element 14 and the reference capacitor element 13. Consequently, the bias voltage ($V_{bias}$) is delivered to an output node 41.

Next, during time interval tb, a power supply line 35 rises from a low ("L") level to an "H" level. Thus, a potential intermediate between the potential of the series capacitor element 14 and that of the reference capacitor element 13 is delivered to the output node 41. Since the capacitance value of the series capacitor element 14 is equal to that of the reference capacitor element 13, $V_1$ that is a potential obtained by adding a bias potential to half the voltage of a power supply line 35 is delivered to the output node 41. This $V_1$ is used as a reference potential.

During time t2 of period T1, the voltage of the reference capacitor element select line 33 is brought to the "L" level, thereby bringing the output of the AND circuit 22 to the "L" level. Consequently, the reference capacitor element control switch 17 enters into a nonconducting state. Meanwhile, the voltage of an infrared-detecting capacitor element select line 34 is brought to the "H" level, thereby bringing the output of the associated AND circuit 23 to the "H" level. As a result, some of infrared-detecting capacitor element control switches 16 provided somewhere along the first row of the matrix pattern are brought into conduction, and some of infrared-detecting capacitor elements 12 provided somewhere along the first row are connected to the associated output lines 30. Furthermore, the voltage of a control line 36A is brought to the "H" level, thereby bringing the associated series capacitor element control switch 15 provided somewhere along the first column into conduction. Consequently, the series capacitor element 14 is connected to the infrared-detecting capacitor element 12 located in the first row and the first column.

During time interval ta, an "H"-level voltage is applied to the bias control line 37, thereby bringing the bias control switch 18 into conduction. Thus, a bias voltage is applied to the node between the series capacitor element 14 and the reference capacitor element 13. Consequently, the bias voltage ($V_{bias}$) is delivered to the output node 41.

Next, during time interval tb, the power supply line 35 rises from the "L" level to the "H" level. Thus, a potential intermediate between the potential of the series capacitor element 14 and that of the reference capacitor element 13 is delivered to the output node 41. Since the capacitance value of each infrared-detecting capacitor element 12 varies depending on the intensity of infrared light incident on the infrared-detecting capacitor element 12, $V_2$ that is a potential obtained by adding a bias voltage to a smaller voltage than half the voltage of the power supply line 35 is delivered to the output node 41 in accordance with the intensity of infrared light incident on the infrared-detecting capacitor element 12. This $V_2$ is defined as a detection potential, and the difference between the reference potential $V_1$ and the detection potential $V_2$ is determined. The determined difference is output as an output signal indicating the intensity of infrared light incident on the infrared-detecting capacitor element 12 located in the first row and the first column.

The intensity of infrared light incident on the infrared-detecting capacitor element 12 located in the first column and the second row is determined based on the reference potential $V_1$ determined likewise during time t3 and the detection potential determined likewise during time t4. The intensity of infrared light incident on the infrared-detecting capacitor element 12 located in the first column and the third row is determined based on the reference potential $V_1$ determined likewise during time t5 and the detection potential determined likewise during time t6. During period T2, the intensities of infrared light incident on the infrared-detecting capacitor elements 12 located in the second column are also determined likewise. During period T3, the intensities of infrared light incident on the infrared-detecting capacitor elements 12 located in the third column are also determined likewise.

In the infrared sensor of this embodiment, a series capacitor element is shared by eight infrared-detecting capacitor elements. This can sharply reduce the area occupied by the series capacitor element. Since the series capacitor element is shared as described above, this allows the series capacitor element to be placed outside a pixel area being a region of the infrared sensor on which infrared light is incident. This can mostly avoid reduction in the aperture ratio of the pixel area due to the presence of one or more series capacitor elements.

For dielectric bolometers, the intensity of infrared light is detected by the difference between the capacitance value of a series capacitor element and that of an infrared-detecting capacitor element. For this reason, the capacitance value of the series capacitor element need be allowed to coincide with that of the infrared-detecting capacitor element when there is no infrared light incident on the infrared-detecting capacitor element. In a case where a series capacitor element is shared by a plurality of infrared-detecting capacitor elements, the capacitance values of the infrared-detecting capacitor elements need be allowed to coincide with one another. However, the infrared-detecting capacitor elements surely have different capacitance values. The reason for this is that when infrared-detecting capacitor elements are fabricated, their films will inevitably have different thicknesses or different properties. In view of the above, in a case where a series capacitor element is simply shared by infrared-detecting capacitor elements, the differences in the offset potentials among the infrared-detecting capacitor elements are produced, resulting in deterioration in measurement accuracy of an infrared sensor. Meanwhile, the infrared sensor of this embodiment is provided with a reference capacitor element, and thus the reference potential is determined using the reference capacitor element and the series capacitor element. Then, the intensity of infrared light is detected using the difference between the determined reference potential and a detection potential. This restrains the influence of the differences in the capacitance values among the infrared-detecting capacitor elements and allows the intensity of infrared light to be detected with high accuracy.

In the infrared sensor of this embodiment, a reference capacitor element is also shared by eight infrared-detecting capacitor elements. This can restrain the aperture ratio of a pixel area from being significantly reduced due to the presence of the reference capacitor element as well.

The intensity of infrared light on a part of the infrared sensor provided with the reference capacitor element can be determined in a pseudo-manner as follows.

Figure 4:
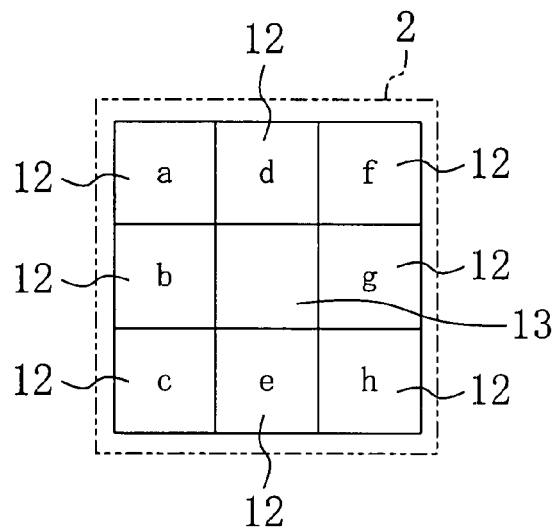
FIG. 4 is a diagram illustrating a method for calculating the intensity of infrared light on a part of the infrared sensor of the first embodiment of the present invention formed with a reference capacitor element.

FIG. 4 shows a pseudo-layout of a reference pixel unit 2 in which a matrix pattern of three rows by three columns is created. In this case, a reference capacitor element 13 is placed in the second row and the second column of the matrix pattern, i.e., the middle of the matrix pattern of three rows by three columns. When the intensities of infrared light detected by eight infrared-detecting capacitor elements 12 are defined as a, b, c, d, e, f, g, and h, respectively, the intensity of infrared light on a part of the infrared sensor provided with the reference capacitor element 13 is determined, for example, by averaging the intensities thereof detected by a total of four of the infrared-detecting capacitor elements, i.e., two of the infrared-detecting capacitor elements which are adjacent to the reference capacitor element 13 and belong to the same column as the reference capacitor element 13 and other two of the infrared-detecting capacitor elements which are adjacent thereto and belong to the same row thereas. In other words, it is determined in accordance with the following formula:

$(b+d+e+g)/4$.

The intensity of infrared light on the part of the infrared sensor provided with the reference capacitor element 13 may be determined by averaging eight infrared-detecting capacitor elements 12 adjacent to the reference capacitor element 13, i.e., in accordance with the formula $(a+b+c+d+e+f+g+h)/8$. Alternatively, it may be determined by calculating a weighted average of the infrared-detecting capacitor elements 12 adjacent to the reference capacitor element 13. In other words, when a coefficient for two of the infrared-detecting capacitor elements 12 belonging to the same column as the reference capacitor element 13 and other two thereof belonging to the same row thereas, i.e., four of the infrared-detecting capacitor elements 12, is defined as $\alpha$ and a coefficient for the other four diagonally arranged infrared-detecting capacitor elements 12 is defined as $\beta$, the intensity of infrared light on the part of the infrared sensor provided with the reference capacitor element 13 may be determined in accordance with the formula $\{\alpha \times (b+d+e+g)+\beta \times (a+c+f+h)\}/8$.

As described above, the infrared sensor of this embodiment can be improved in aperture ratio without being deteriorated in detection accuracy.

Although in this embodiment a matrix pattern forming a reference pixel unit has a size of three rows by three columns, the size of the matrix pattern may be arbitrarily changed. Furthermore, although in this embodiment the reference capacitor element is placed in the second row and the second column of the matrix pattern, i.e., the middle of the matrix pattern, the location of the reference capacitor element may be arbitrarily changed.

Embodiment 2

Figure 5:
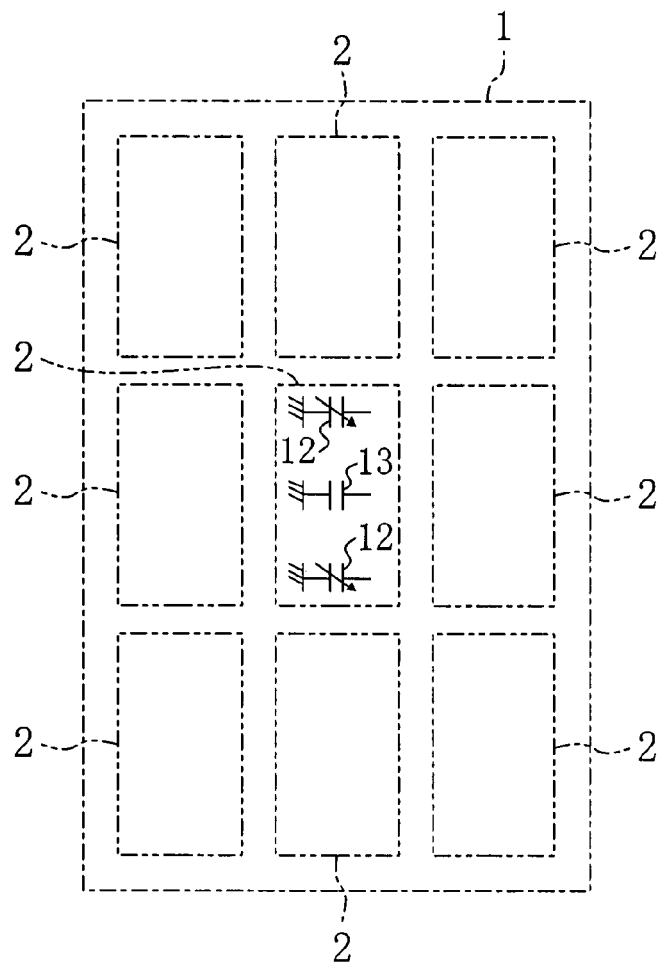
FIG. 5 is a layout diagram illustrating an infrared sensor according to a second embodiment of the present invention.

A second embodiment of the present invention will be described hereinafter with reference to the drawings. FIG. 5 shows the layout of an infrared sensor according to the second embodiment. As shown in FIG. 5, in a pixel area 1 on which infrared light is incident, a plurality of reference pixel units 2 are arranged in a two-dimensional matrix pattern. Each reference pixel unit 2 includes a plurality of infrared-detecting capacitor elements 12 and a single reference capacitor element 13. The infrared-detecting capacitor elements and the reference capacitor element are arranged together in a one-dimensional array.

Figure 6:
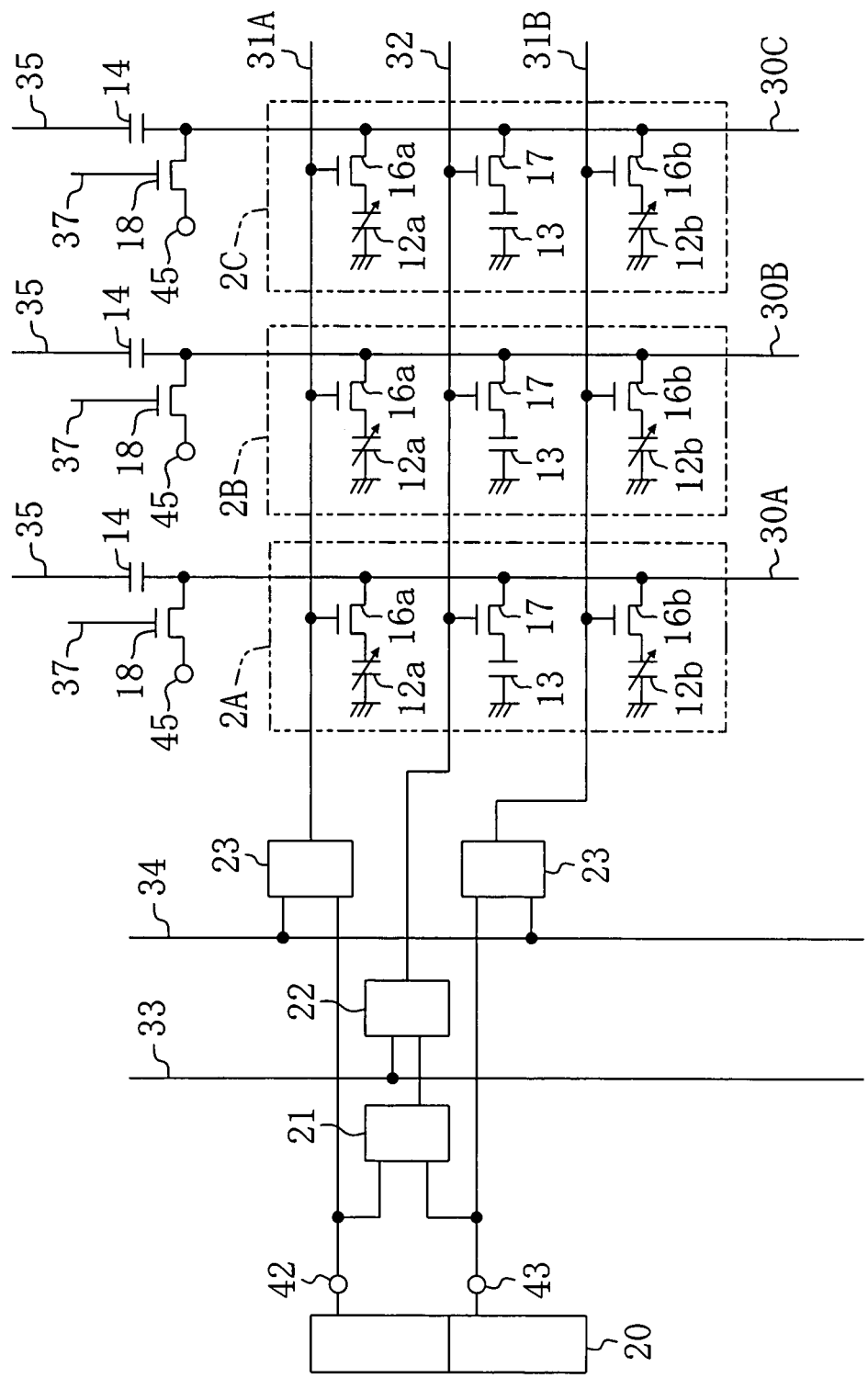
FIG. 6 is a circuit diagram illustrating reference pixel units of the infrared sensor of the second embodiment of the present invention and their peripheral circuits.

FIG. 6 shows a circuit configuration in which reference pixel units 2A, 2B and 2C out of reference pixel units 2 of the infrared sensor of this embodiment and their peripheral circuits are extracted. As shown in FIG. 6, each reference pixel unit 2 is configured such that a reference capacitor element 13 and infrared-detecting capacitor elements 12a and 12b are arranged in a one-dimensional array.

One terminal of the reference capacitor element 13 included in the reference pixel unit 2A is grounded, and the other terminal thereof is connected to an output line 30A via the associated reference capacitor element control switch 17. One terminal of each of the two infrared-detecting capacitor elements 12a and 12b included in the reference pixel unit 2A is grounded, and the other terminals are connected to the output line 30A via the associated infrared-detecting capacitor element control switches 16a and 16b, respectively.

Likewise, the reference capacitor element 13 and the infrared-detecting capacitor elements 12a and 12b all included in the reference pixel unit 2B are connected to an output line 30B, and the reference capacitor element 13 and the infrared-detecting capacitor elements 12a and 12b all included in the reference pixel unit 2C are connected to an output line 30C.

One end of each of the output lines 30A, 30B and 30C is connected to one terminal of the associated series capacitor element 14. The other terminals of the series capacitor elements 14 are connected to associated power supply lines 35. Bias terminals 45 are connected via associated bias control switches 18 to the associated output lines 30A, 30B and 30C, thereby applying predetermined voltages to the output lines 30A, 30B and 30C. The bias control switches 18 are driven by associated bias control lines 37.

Control terminals of reference capacitor element control switches 17 are connected to a reference capacitor element control line 32. Control terminals of infrared-detecting capacitor element control switches 16a are connected to an infrared-detecting capacitor element control line 31A, and control terminals of infrared-detecting capacitor element control switches 16b are connected to an infrared-detecting capacitor element control line 31B. The reference capacitor element control line 32 is connected to an output terminal of an AND circuit 22, and input terminals of the AND circuit 22 are connected to a reference capacitor element select line 33 and an output terminal of an OR circuit 21, respectively. Each of input terminals of the OR circuit 21 is connected to associated one of the first- and second-stage output terminals 42 and 43 of a vertical shift register 20 having two stages.

The infrared-detecting capacitor element control line 31A is connected to an output terminal of an associated AND circuits 23, one input terminal of which is connected to an infrared-detecting capacitor element select line 34 while the other input terminal is connected to the output terminal 42 of the vertical shift register 20. The infrared-detecting capacitor element control line 31B is connected to an output terminal of another AND circuit 23, one input terminal of which is connected to the infrared-detecting capacitor element select line 34 while the other input terminal is connected to the output terminal 43 of the vertical shift register 20.

Figure 7:
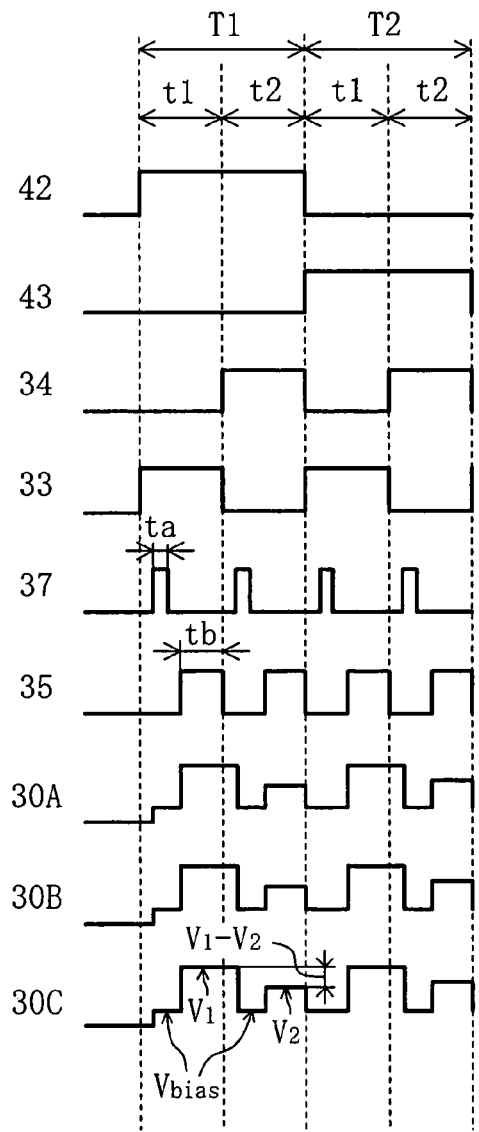
FIG. 7 is a timing chart illustrating an operation of the infrared sensor according to the second embodiment of the present invention.

An operation of the infrared sensor of this embodiment will be described hereinafter. FIG. 7 is a timing chart showing operations of the reference pixel units 2 and their peripheral circuits both shown in FIG. 6.

First, at the beginning of time t1 of period T1, the voltage of a first-stage output terminal 42 of a vertical shift register 20 is brought to an "H" level. Thus, an "H"-level signal is applied to an input terminal of an OR circuit 21, thereby bringing the output of the OR circuit 21 to the "H" level.

During time t1, the voltage of a reference capacitor element select line 33 is also brought to the "H" level, thereby bringing the voltage of a reference capacitor element control line 32 connected to the output of an AND circuit 22 to the "H" level. Thus, reference capacitor element control switches 17 are brought into conduction. Consequently, series capacitor elements 14 are connected to associated reference capacitor elements 13.

During time interval ta, "H"-level voltages are applied to bias control lines 37, thereby bringing bias control switches 18 into conduction. Thus, bias voltages ($V_{bias}$) are applied to the nodes between the series capacitor elements 14 and the associated reference capacitor elements 13. Consequently, the voltages of all of the output lines 30A, 30B and 30C become $V_{bias}$.

Next, during time interval tb, power supply lines 35 rise from an "L" level to the "H" level. Thus, a potential intermediate between the potential of each series capacitor element 14 and that of the associated reference capacitor element 13 is delivered to an output node. Since the capacitance value of the series capacitor element 14 is equal to that of the reference capacitor element 13, $V_1$ that is a potential obtained by adding a bias potential to half the voltage of one of power supply lines 35 associated with the series capacitor element 14 is delivered to corresponding one of the output lines 30A, 30B and 30C. This $V_1$ is used as a reference potential.

During time t2 of period T1, the voltage of a reference capacitor element select line 33 is brought to the "L" level, thereby bringing the output of the AND circuit 22 to the "L" level. Consequently, the reference capacitor element control switches 17 enter into a nonconducting state. Meanwhile, the voltage of an infrared-detecting capacitor element select line 34 is brought to the "H" level, thereby bringing the outputs of the AND circuits 23 to the "H" level. As a result, the voltage of an infrared-detecting capacitor element control line 31A is brought to the "H" level, thereby bringing the infrared-detecting capacitor element control switches 16a into conduction. Consequently, the series capacitor elements 14 are connected to infrared-detecting capacitor elements 12a.

During time interval ta, "H"-level voltages are applied to bias control lines 37, thereby bringing bias control switches 18 into conduction. Thus, bias voltages are applied to the nodes between the series capacitor elements 14 and the reference capacitor elements 13. Consequently, the voltages of all of the output lines 30A, 30B and 30C become $V_{bias}$.

Next, during time interval tb, the power supply lines 35 rise from the "L" level to the "H" level. Thus, a potential intermediate between the potential of each series capacitor element 14 and that of the associated infrared-detecting capacitor element 12a is delivered to associated one of the output lines 30A, 30B and 30C. Since the capacitance value of each infrared-detecting capacitor element 12a varies depending on the intensity of infrared light incident on the infrared-detecting capacitor element 12a, $V_2$ that is a potential obtained by adding a bias voltage to a smaller voltage than half the voltage of associated one of power supply lines 35 is delivered to associated one of the output lines 30A, 30B and 30C in accordance with the intensity of infrared light incident on the infrared-detecting capacitor element 12a. This $V_2$ is defined as a detection potential, and the difference between the reference potential $V_1$ and the detection potential $V_2$ is determined. The determined difference is output as an output signal indicating the intensity of infrared light incident on the infrared-detecting capacitor element 12a.

During period T2, the intensities of infrared light incident on infrared-detecting capacitor elements 12b can be detected in the same manner.

In the infrared sensor of this embodiment, infrared-detecting capacitor elements and a reference capacitor element are arranged in a one-dimensional array within a reference pixel unit. Use of this infrared sensor allows infrared-detecting capacitor elements to be read out at a higher speed than use of the infrared sensor of the first embodiment.

Figure 8:
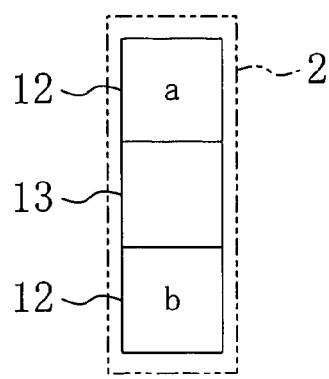
FIG. 8 is a diagram illustrating a method for calculating the intensity of infrared light on a reference capacitor element of the infrared sensor of the second embodiment of the present invention.

Like the infrared sensor of the first embodiment, the intensity of infrared light on a part of the infrared sensor of this embodiment provided with a reference capacitor element can also be determined in a pseudo-manner. In this case, as shown in FIG. 8, detected values for two infrared-detecting capacitor elements located to both sides of a reference capacitor element need be averaged. Alternatively, a weighted average of these values may be determined.

Figure 9:
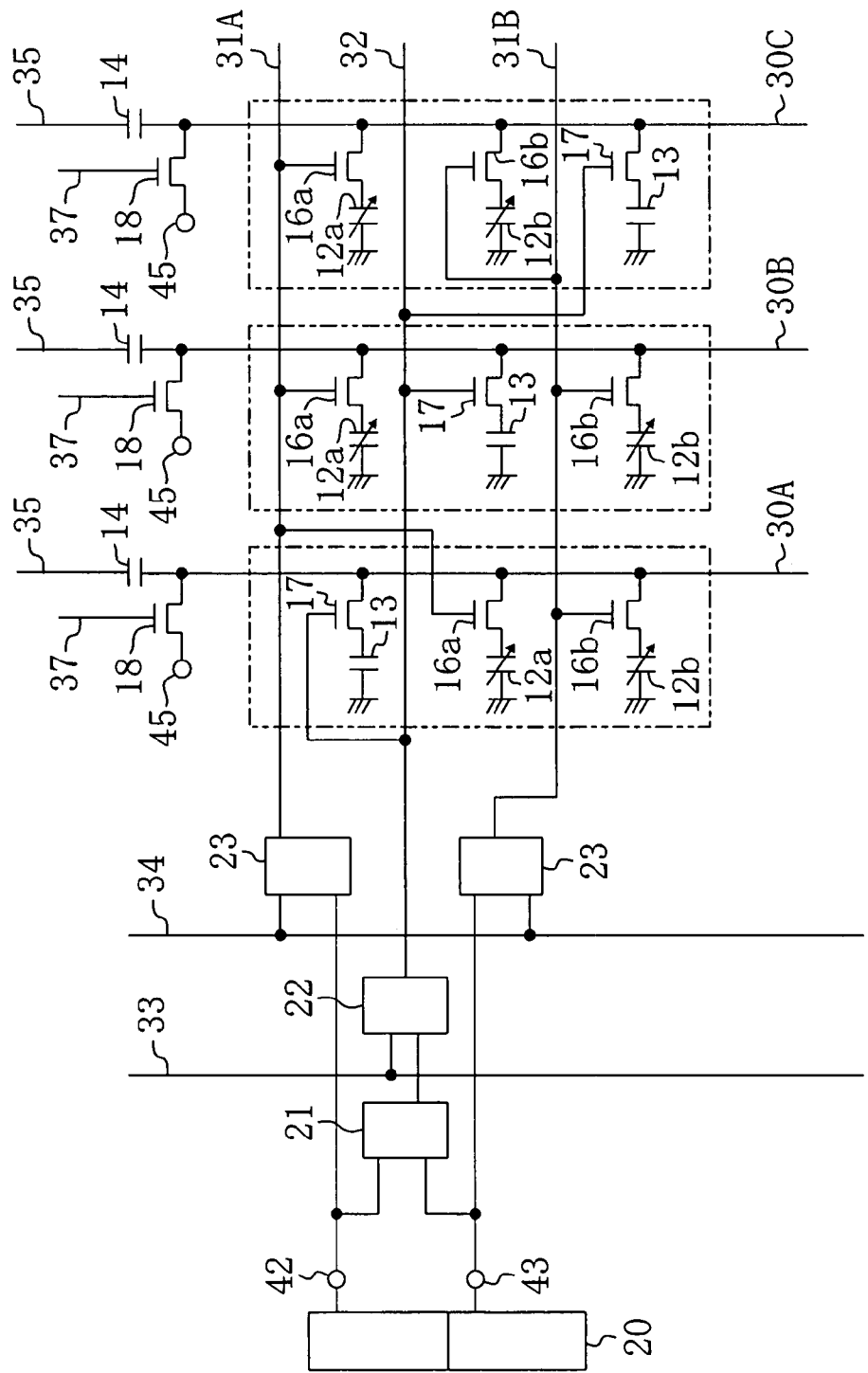
FIG. 9 is a circuit diagram illustrating another exemplary arrangement of reference pixel units of the infrared sensor of the second embodiment of the present invention and their peripheral circuits.

Although in this embodiment a reference capacitor element is placed between two infrared-detecting capacitor elements, the location of the reference capacitor element may be changed as shown in FIG. 9.

Although in this embodiment a reference pixel unit is composed of two infrared-detecting capacitor elements and a single reference capacitor element, the number of infrared-detecting capacitor elements included in the reference pixel unit may be arbitrarily increased.

Modification of Embodiment 2

Figure 10:
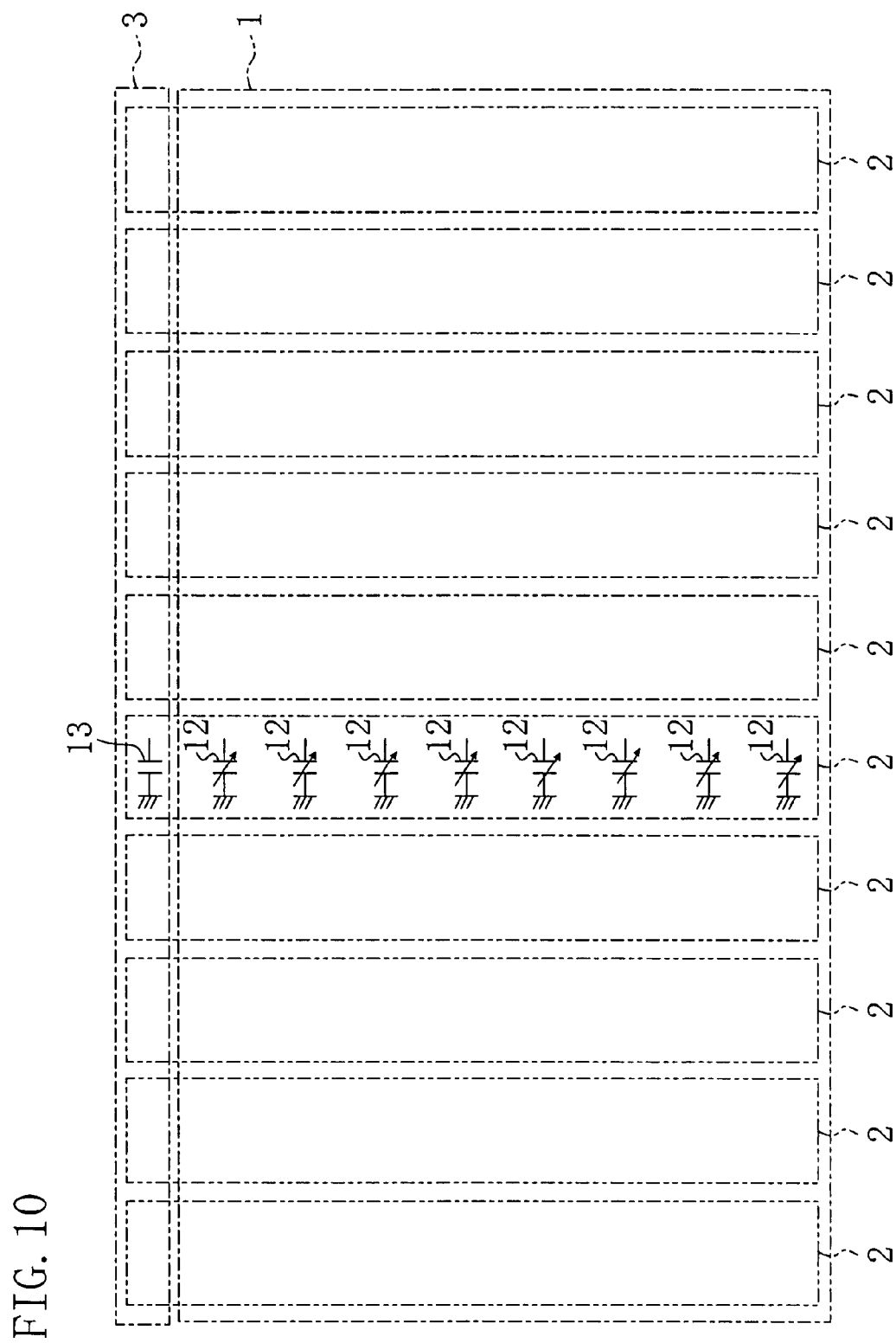
FIG. 10 is a layout diagram illustrating an infrared sensor according to a modification of the second embodiment of the present invention.

A modification of the second embodiment of the present invention will be described hereinafter with reference to the drawings. FIG. 10 shows the layout of an infrared sensor according to this modification. As shown in FIG. 10, in the infrared sensor of this modification, a pixel area 1 is provided with only parts of pixel reference units 2 in which infrared-detecting capacitor elements 12 are located, and reference capacitor elements 13 are located in a reference capacitor element formation area 3 located outside the pixel area 1. This can prevent the aperture ratio of the pixel area 1 from being reduced due to the presence of the reference capacitor elements 13.

Since as described above reference capacitor elements 13 are placed in a reference capacitor element formation area 3 located outside a pixel area 1, only infrared-detecting capacitor elements 12 are placed in the pixel area 1. Accordingly, the intensity of infrared light incident on the entire pixel area 1 can be determined. The circuit configuration and operation of the infrared sensor of this modification are substantially the same as those of the infrared sensor of the second embodiment, and therefore their description is omitted.

Figure 11:
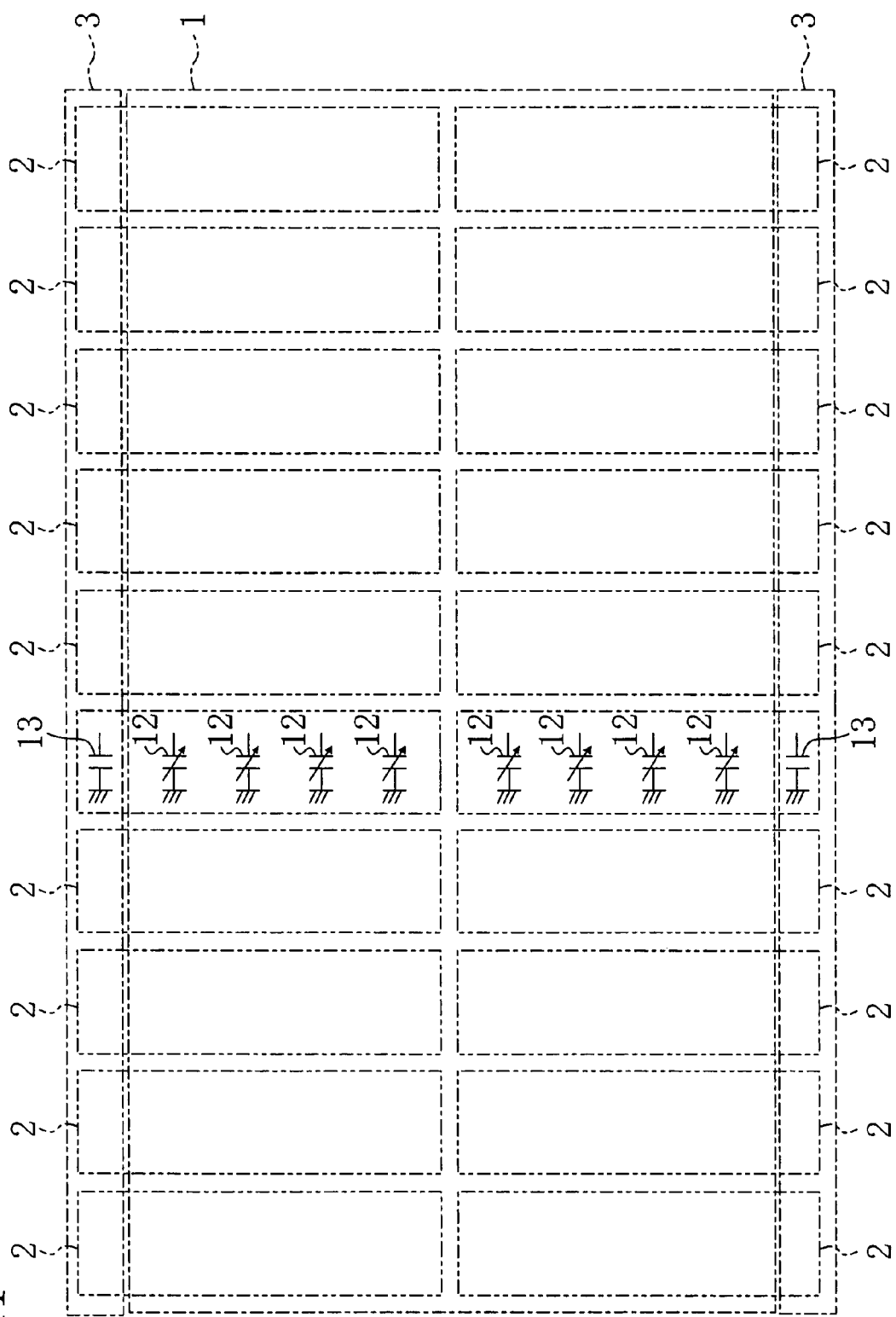
FIG. 11 is a layout diagram illustrating another example of the infrared sensor according to the modification of the second embodiment of the present invention.
Figure 12:
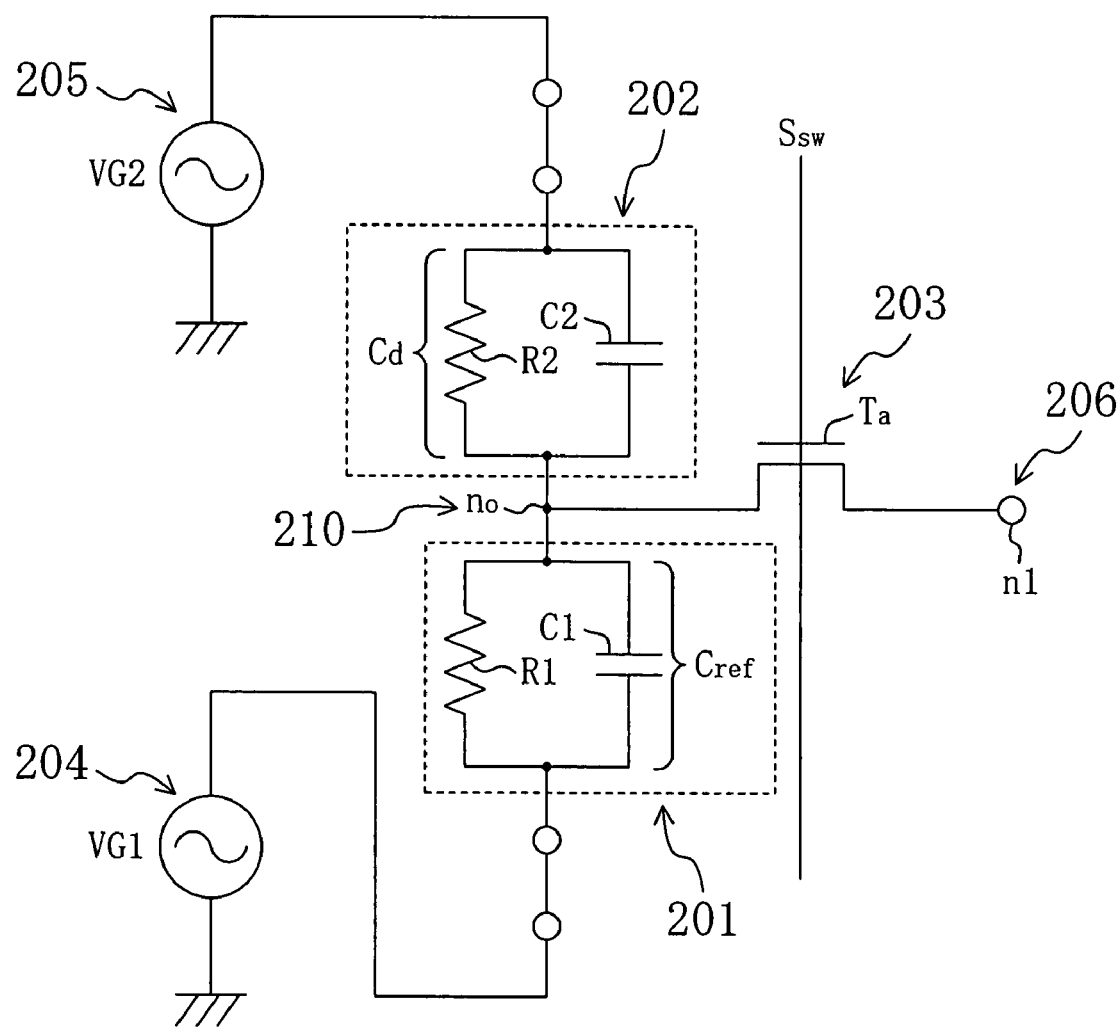
FIG. 12 is a circuit diagram illustrating an infrared sensor according to a known example.
Figure 13:
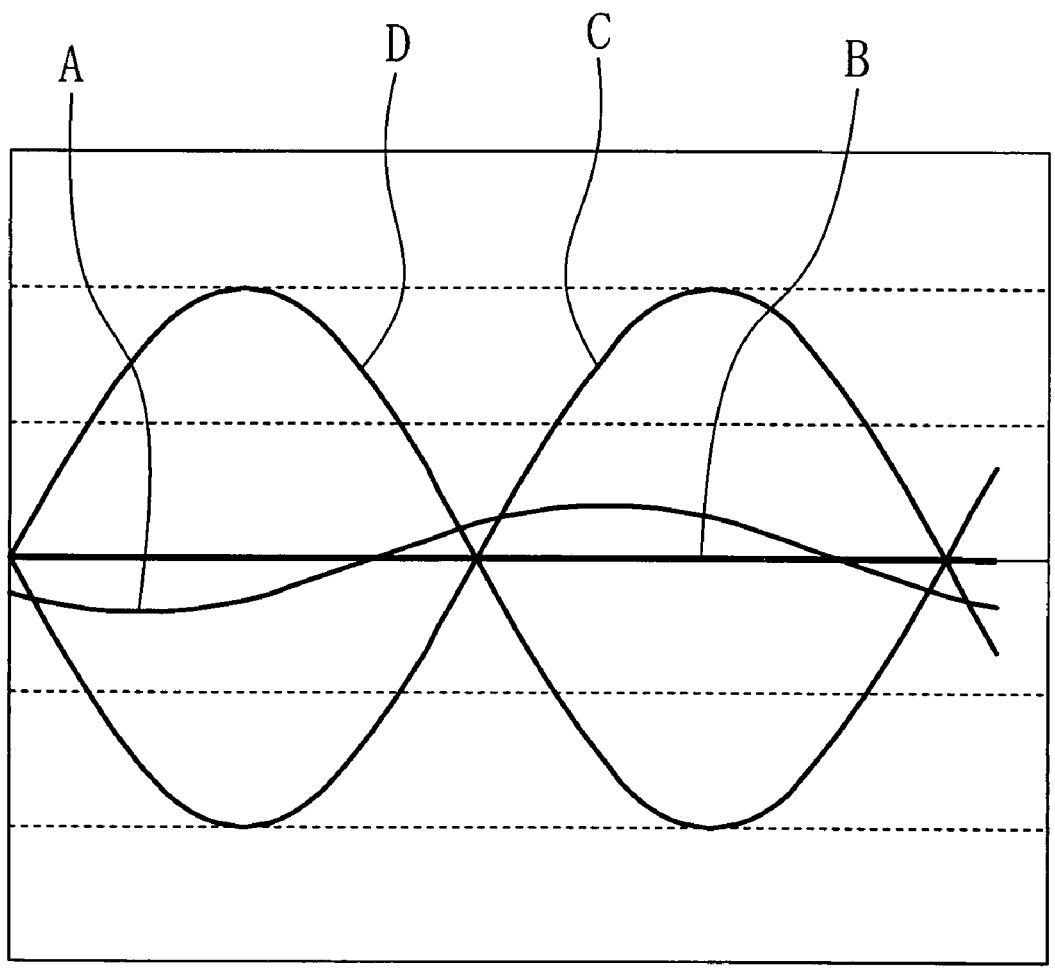
FIG. 13 is a graph illustrating a drive signal of the infrared sensor according to the known example.

As shown in FIG. 11, reference capacitor element formation areas 3 may be located to both sides of a pixel area 1. This can increase the number of reference pixel units 2 that can be placed in the pixel area 1. In view of the above, the number of infrared-detecting capacitor elements 12 included in each reference pixel unit 2 can be reduced while preventing the number of infrared-detecting capacitor elements 12 included in the pixel area 1 from being reduced. As a result, the reading rate of the infrared sensor can be improved.

In this modification, the distance between each infrared-detecting capacitor element 12 and an associated reference capacitor elements 13 can become shorter than when the reference capacitor element 13 is located only to one side of a pixel area 1. This can further improve the detection accuracy of the infrared sensor.

In this case, when each of series capacitor elements 14 is located to the same side of the pixel area 1 as the associated reference capacitor element 13, this can shorten the distances between the series capacitor element 14 and the associated reference capacitor element 13 or the associated infrared-detecting capacitor elements 12. This can further improve the detection accuracy.

INDUSTRIAL APPLICABILITY

An infrared sensor of the present invention can have high detection accuracy while preventing the aperture ratio of a pixel from being reduced and is useful as an infrared sensor for detecting infrared light radiated from an object or a human body.

The invention claimed is:

1. An infrared sensor comprising:
a plurality of reference pixel units each including an output line, a reference capacitor element connected via a switching element between the output line and a ground, and a plurality of infrared-detecting capacitor elements whose capacitance values vary depending on the intensities of infrared light incident on the infrared-detecting capacitor elements, said reference pixel units being arranged in a matrix pattern; and
a plurality of series capacitor elements each connected between the associated output line and an associated power supply line, said series capacitor elements being provided in a one-to-one correspondence with the reference pixel units.

2. The infrared sensor of claim 1, wherein
the capacitance value of the reference capacitor element and that of the associated series capacitor element are equal to that of each of the associated infrared-detecting capacitor elements when there is no infrared light incident on said associated infrared-detecting capacitor elements.

3. The infrared sensor of claim 1, wherein
in each said reference pixel unit, the reference capacitor element and the infrared-detecting capacitor elements are arranged in a one-dimensional array.

4. The infrared sensor of claim 1, wherein
in each said reference pixel unit, the reference capacitor element and the infrared-detecting capacitor elements are arranged in a two-dimensional array.

5. The infrared sensor of claim 1, wherein
the series capacitor elements are placed outside a pixel area on which infrared light is incident.

6. The infrared sensor of claim 1, wherein
the series capacitor elements and the reference capacitor elements are placed outside a pixel area on which infrared light is incident.

7. The infrared sensor of claim 6, wherein
the reference capacitor elements are located in a first reference capacitor element formation area and a second reference capacitor element formation area located to both sides of the pixel area, respectively, with the pixel area interposed between the first and second reference capacitor element formation areas,
some of the infrared-detecting capacitor elements included in the same reference pixel unit as the reference capacitor element located in the first reference capacitor element formation area are located in a region of the pixel area near the first reference capacitor element formation area, and
some of the infrared-detecting capacitor elements included in the same reference pixel unit as the reference capacitor element located in the second reference capacitor element formation area are located in a region of the pixel area near the second reference capacitor element formation area.

8. The infrared sensor of claim 7, wherein
the series capacitor elements are located in a region of the infrared sensor located outside the pixel area and to a side of the pixel area to which the reference capacitor elements associated with the series capacitor elements are located.

9. The infrared sensor of claim 1, wherein
a potential of the output line is brought to a reference potential by turning ON the switching element connected between the reference capacitor element and the output line and applying a predetermined voltage between the series capacitor element and the reference capacitor element,
a potential of the output line is brought to a detection potential by turning ON the switching element connected between predetermined one of the infrared-detecting capacitor elements and the output line and applying a predetermined voltage between the series capacitor element and said predetermined one of the infrared-detecting capacitor elements, and
the potential difference between the reference potential and the detection potential is output as an output signal indicating the intensity of infrared light incident on said predetermined one of the infrared-detecting capacitor elements.

10. The infrared sensor of claim 1, wherein
a potential of the output line is brought to a reference potential by turning ON the switching element connected between the reference capacitor element and the output line and applying a predetermined voltage between the series capacitor element and the reference capacitor element,
a potential of the output line is brought to a detection potential by turning ON the switching element connected between predetermined one of the infrared-detecting capacitor elements and the output line and applying a predetermined voltage between the series capacitor element and said predetermined one of the infrared-detecting capacitor elements,
the potential difference between the reference potential and the detection potential is output as an output signal indicating the intensity of infrared light incident on said predetermined one of the infrared-detecting capacitor elements, and
the intensity of infrared light incident on a part of the reference pixel unit provided with the reference capacitor element is calculated using respective output signals of the plurality of infrared-detecting capacitor elements arranged around the reference capacitor element and included in one of the reference pixel units to which the reference capacitor element belongs.

11. A method for driving an infrared sensor comprising: a reference pixel unit including an output line, a reference capacitor element connected via a switching element between the output line and a ground, and a plurality of infrared-detecting capacitor elements whose capacitance values vary depending on the intensities of infrared light incident on the infrared-detecting capacitor elements; and a series capacitor element connected between the output line and a power supply line, said method comprising the step of
(a) sequentially outputting the intensities of infrared light incident on the infrared-detecting capacitor elements included in the reference pixel unit,
wherein the step (a) includes the sub-steps of:
(a1) turning ON the switching element connected to the reference capacitor element while electrically connecting the reference capacitor element and the output line together, and thereafter applying a predetermined voltage between the reference capacitor element and the series capacitor element, thereby reading a reference potential and delivering the reference potential to the output line;
(a2) after the step (a1), turning ON the switching element connected to one of the plurality of infrared-detecting capacitor elements while electrically connecting said one of the plurality of infrared-detecting capacitor elements and the output line together, and thereafter applying a predetermined voltage between said one of the plurality of infrared-detecting capacitor elements and the series capacitor element, thereby reading a detection potential and delivering the detection potential to the output line; and
(a3) after the steps (a1) and (a2), determining a potential difference between the reference potential and the detection potential and outputting the determined potential difference as the intensity of infrared light incident on said one of the plurality of infrared-detecting capacitor elements.

12. The method of claim 11, wherein
the reference capacitor element and the infrared-detecting capacitor elements are located in a pixel area on which infrared light is incident, and
the method further comprises the step of (b) after the step (a), calculating the intensity of infrared light incident on a part of the pixel area provided with the reference capacitor element on the basis of the intensities of infrared light incident on some of the plurality of infrared-detecting capacitor elements adjacent to the reference capacitor element.

13. The method of claim 12, wherein
the step (b) is the step of determining an average value of the intensities of infrared light incident on some of the plurality of infrared-detecting capacitor elements adjacent to the reference capacitor element.

* * * * *